Figure 1:
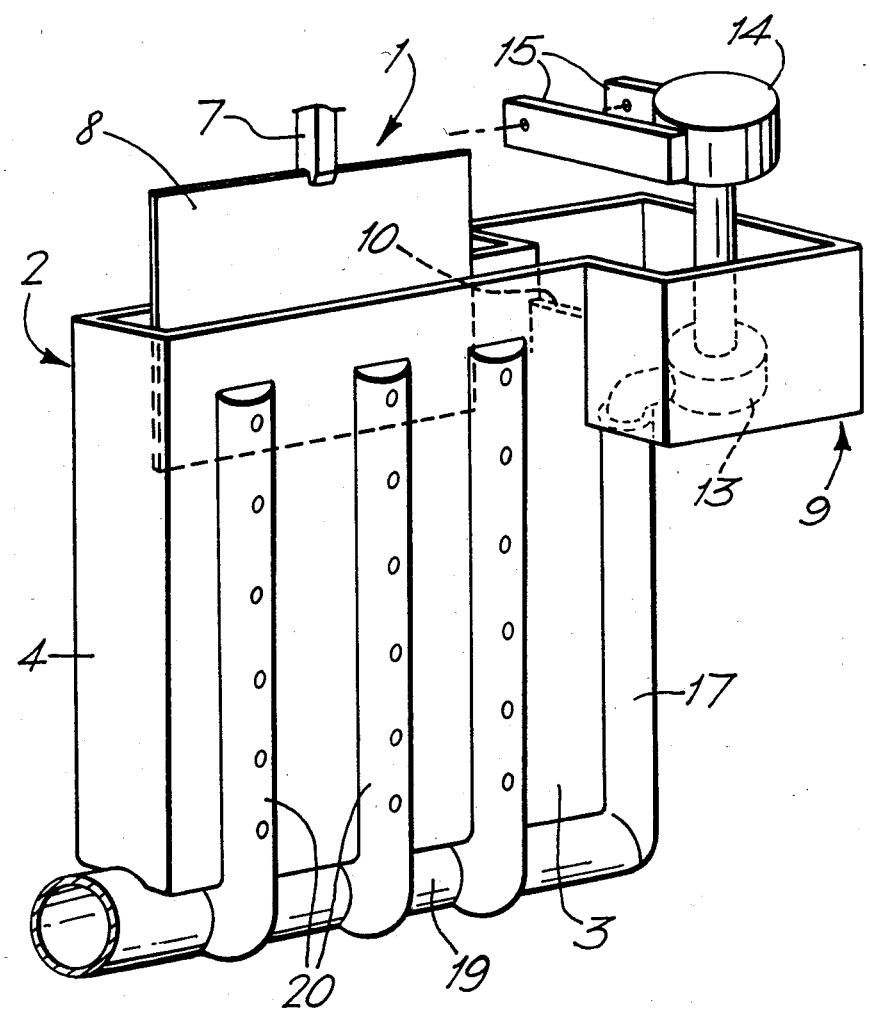

United States Patent [19]

Lymn

[11] Patent Number: 4,599,966
[45] Date of Patent: Jul. 15, 1986

[54] SOLDER LEVELLER

[76] Inventor: Peter A. P. Lymn, 64 Heath Rd., Petersfield, Hampshire, United Kingdom

[21] Appl. No.: 683,415

[22] Filed: Dec. 19, 1984

[30] Foreign Application Priority Data

Dec. 22, 1983 [GB] United Kingdom ............... 8334122

[51] Int. Cl.⁴ .................................................. B05C 3/10
[52] U.S. Cl. ........................................ 118/63; 118/425; 118/429; 134/199
[58] Field of Search ................. 118/429, 425, 63; 427/98; 134/199; 228/20

[56] References Cited

U.S. PATENT DOCUMENTS

| 1,579,003 | 3/1926 | Koch | 118/429 X |
| 3,865,298 | 2/1975 | Allen et al. | 118/63 X |
| 4,072,777 | 2/1978 | Schoenthaler | 118/429 X |
| 4,083,323 | 4/1978 | Rote | 118/425 X |

FOREIGN PATENT DOCUMENTS

| 1446636 | 8/1976 | United Kingdom | 118/425 |
| 2031036 | 4/1980 | United Kingdom | 118/429 |

Primary Examiner—John P. McIntosh
Attorney, Agent, or Firm—Lee A. Strimbeck

[57] ABSTRACT

A solder leveller comprising a solder bath into which a board to be soldered can be inserted and then, as it is withdrawn, levelled by air knives positioned above the bath. Recirculating means are provided in the form of ducts on each side wall of the bath, the ducts having ports directing a flow of solder against opposite sides of a board to bias the board away from the sidewalls of the bath, thereby reducing the risk of the board being scratched as it is inserted and withdrawn from the bath.

8 Claims, 3 Drawing Figures

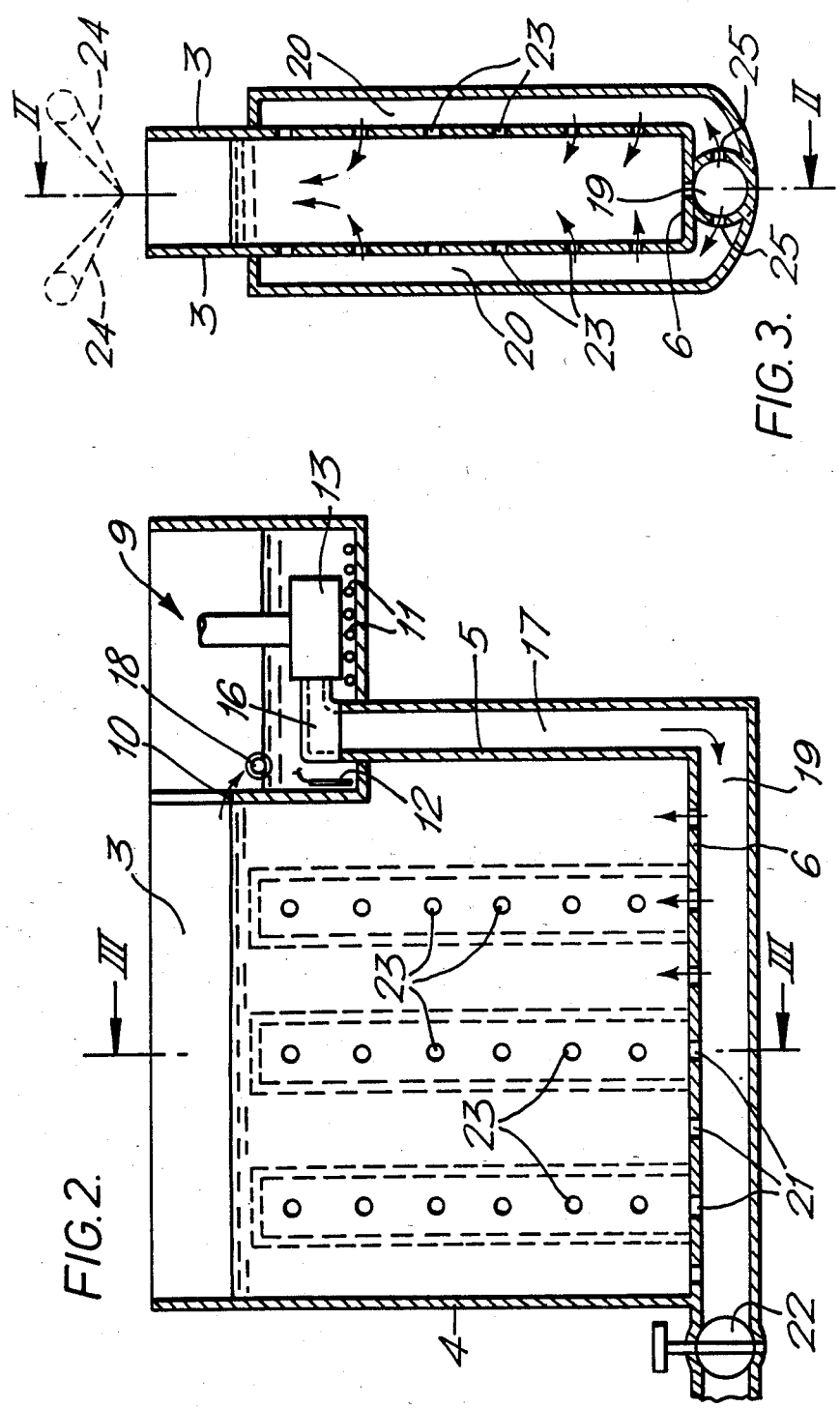

SOLDER LEVELLER

BACKGROUND OF THE INVENTION

The present invention relates to a solder leveller.

A solder leveller is apparatus for coating exposed metal—normally copper—on printed circuit boards, and similar elements—particularly for supporting electronic components—hereinafter referred to as "boards", with solder preparatory to connection of components thereto. As hereinafter referred to a "solder leveller" is defined to comprise a solder bath, into which a board to be soldered is lowered, and means for levelling solder deposited on the board as it is withdrawn from the bath.

The solder levelling means is intended to for instance provide a substantially uniform thickness of solder on the exposed copper and to unblock any holes through the board which might otherwise be blocked by solder. The levelling means may be arranged to direct hot liquid at the board as it is withdrawn from the solder. However, it is presently preferred to direct hot air at the board by means of so called "air knives" for levelling the solder as the board is withdrawn from the solder bath.

Prior Art

Such a solder leveller is described in U.S. Pat. No. 3,865,298, in the names of Travis A. Allen and Robert T. Sylvester. However it should be noted that this prior leveller comprises means for deflecting hot air from the air knives away from the surface of the molten solder in the solder bath. These deflection means can in practice be dispensed with, particularly where the molten solder in the bath is continuously recirculated whereby any flux and/or dross (oxidized solder) is carried by the flow of the molten solder away from the area of the surface of the molten solder through which the board is to be inserted.

When large boards are being treated in such a recirculating solder leveller, a board may be displaced from its preferably central position in the solder bath to the extent that it is scratched on withdrawal from the bath. Scratching is likely to result in the board being reject. Such scratching has been thought to result from contact with the nozzles of the air knives. However we believe it results from contact with the walls of the solder bath.

The usual manner of supporting a board for insertion in the bath is from above. If the support does not hold the board at its lower end truly central with the bath where the flow in the bath is such as not to bias the board to one side, or even if the board is held truly central yet the flow from an accidental accumulation of manufacturing tolerances is such as to deflect the board to one side; it is possible for the board to be deflected by the flow of solder to one side of the bath and contact the corresponding side wall whereby on withdrawal of the board it scrapes along the side wall and becomes scratched.

SUMMARY OF THE INVENTION

The object of the invention is to provide an improved solder leveller.

According to the invention there is provided a solder leveller as hereinbefore defined including means for recirculating molten solder to and from the solder bath in such manner that the flow of solder in the solder bath biasses a board inserted therein away from side walls of the solder bath.

Conventionally the molten solder has been recirculated to the bath via ports provided in the bottom wall of the bath. Additional ports may be provided in the side walls of the bath for the said biassing flow.

Alternatively bottom wall ports may be dispensed with and the side wall ports alone used for recirculating the solder to the bath and for the said biassing flow.

Other alternatives can be envisaged. For instance the said biassing flow may be produced by arranging bottom ports in close association with the side walls whereby the solder flow is directed strongly along the side walls, leaving a relatively stagnant space centrally of the bath into which the board may be inserted. Alternatively bottom ports may be provided with directed outlets, directing flow away from the side walls.

A further alternative is the provision of ducts within the bath running up the respective side walls of the bath and having outlets directing flow away from the respective side walls. Such ducts could be fed directly with solder recirculated to the bath or with solder flowing from bottom ports for instance.

It should be noted that since the boards usually have appreciable width—and may be mounted side-by-side widthwise—the solder bath will normally have side walls which are considerably wider than the width of end walls of the bath. Although it is conceivable that the end walls may be provided with ports corresponding to ports in the side walls, such end wall ports are unlikely to be normally required.

Although each side wall port may be fed with its own molten solder supply pipe, the side wall ports are preferably provided in sets of ports one above the other fed by a single duct for each set. Conveniently these ducts may be fed from a corresponding duct supplying bottom ports. The side wall ports may be directed upwards to align towards the general upwards flow of solder in the bath, however they are preferably directed perpendicularly to the side walls to give a maximum effect should a board approach closely.

THE DRAWINGS

To help understanding of the invention, a specific embodiment thereof will now be described by way of example and with reference to the accompanying drawings in which:

FIG. 1 is a perspective view of a solder leveller in accordance with the invention, FIG. 2 is a cross-sectional side view of the solder leveller of FIG. 1 on the line II—II in FIG. 3, and FIG. 3 is a cross-sectional end view on the line III—III in FIG. 2.

PREFERRED EMBODIMENT

The solder leveller 1 of the drawings has a solder bath 2 having parallel spaced apart side walls 3, end walls 4,5 and a bottom wall 6. Arranged above the bath is a board insertion arm 7 adapted to grip a board 8, and insert and remove it from the bath. The arm is driven by means forming no part of the present invention and accordingly not illustrated.

At the upper end of the end wall 5 is arranged a pump tank 9 from which molten solder is pumped to the solder bath. The height of the solder in the bath is controlled by a sluice 10 in the end wall 5, over which sluice solder flows to the pump tank 9. Heating elements 11 are provided at the bottom of the pump tank for heating the molten solder to a desired temperature under the control of a thermocouple 12. The bath 2 and tank 9, except for their tops, are enclosed in thermal insulation, not shown. A pump 13 driven by an electric motor 14 circulates the molten solder. The pump and motor are together mounted on arms 15 whereby they may be swung up out of the tank as required. When swung into the tank, the outlet 16 from the pump engages with the mouth of a duct 17 running down outside the end wall 5. The inlet to the pump, a centrifugal pump, is positioned on the underside thereof. The tank is provided with an outlet 18 below the level of the sluice 10 for draining off any flux and dross which may be carried from the bath 2; it should be noted that during operation, the surface of the solder will be higher in the bath 2 than in the tank 9.

At its lower end the duct 17 communicates with a bottom duct 19 passing along beneath the bottom wall 6. At each side of the bath, three side wall ducts 20 pass up their respective side walls. The walls of the bath and of the tank and the ducts are all fabricated from steel plate and pipe welded together. A series of bottom wall ports 21 are provided for introducing molten solder from the bottom duct 19 into the bath and a series of bottom wall ports 24 for introducing molten solder from the bottom duct 19 into the side wall ducts 20. (A drain valve 22, shown only in FIG. 2, is provided at the end of the bottom duct remote from the duct 17.) Along the length of each side wall duct 20 a set of side wall ports 23 spaced one above another is provided for introducing solder laterally into the solder bath. It will be appreciated that, should a board approach either side wall, flow from the ports in the respective side wall ducts will bias the board away from the side wall. The ports 23 are formed so as to provide a flow perpendicular to the side walls 3 but they may be formed so as to provide an upward flow of molten solder against the sides of an inserted board. The general flow directions are shown by arrows in FIGS. 2 and 3. The ports 21 are in the form of drillings perpendicular to the wall 6 and the ports 24 drilled to provide a horizontal flow into the side wall ducts 20. Alternatively pairs of ports 21 may be provided and angled to provide a flow of molten solder upwards and against the side walls 3 to create a stagnant space therebetween. Such pairs of ports 21 may be angled in an opposite direction so that the flow of molten solder is away from the side walls 3 and towards the opposite sides of an inserted board to bias it away from the side walls. The upper end of each sidewall duct 20 is plated over.

Air knives 24 for levelling solder on a board as it is withdrawn from the solder bath are shown in outline in FIG. 3 only.

I claim:

1. A solder leveller comprising a solder bath, into which a board to be soldered is lowered, and means for levelling solder deposited on the board as it is withdrawn from the bath, wherein said bath comprises parallel spaced apart side walls, end walls and a bottom wall; and means for recirculating molten solder to and from said bath, said recirculating means comprising a plurality of side wall ducts extending upwardly (each positioned on said side walls and running up) from said bottom wall towards the top of said side walls and positioned on each of said side walls, said side wall ducts having side wall ports therein one above another to direct a flow of solder against opposite sides of a board inserted in the bath, an elongate bottom wall duct extending along said bottom wall of said bath, said elongate bottom wall duct having ports communicating with the lower ends of the side wallducts, and means for pumping soler through said elongate bottom wall duct, said side wall ducts and said bath.

2. A solder leveller according to claim 1, wherein said side wall ducts are positioned on said side walls of said bath with said side wall ports facing inwardly and located one above another.

3. A solder leveller according to claim 2, wherein said side wall ports are so formed in said side walls as to direct the flow of solder perpendicular to said side walls.

4. A solder leveller according to claim 2 wherein said side wall ports are so formed in said side walls as to direct the flow of solder at an angle to said side wall ducts.

5. A solder leveller according to claim 1 including a tank for containing solder, and wherein said means for pumping solder includes a pump to pump solder through said recirculating means.

6. A solder leveller according to claim 5, wherein said tank is mounted on said bath which includes a weir to maintain a pre-determined level of solder within said bath, and allow any excess solder in said bath to flow over said weir into said tank.

7. A solder leveller according to claim 5, wherein said pump is a centrifugal pump mounted in said tank.

8. A solder leveller according to claim 1 wherein said elongate bottom wall duct further includes bottom wall ports communicating with the interior of said bath.

* * * * *